(12) United States Patent
Su et al.

(10) Patent No.: US 8,617,926 B2
(45) Date of Patent: Dec. 31, 2013

(54) SEMICONDUCTOR CHIP DEVICE WITH POLYMERIC FILLER TRENCH

(75) Inventors: Michael Z. Su, Round Rock, TX (US); Gamal Refai-Ahmed, Markham (CA); Bryan Black, Spicewood, TX (US)

(73) Assignees: Advanced Micro Devices, Inc., Sunnyvale, CA (US); ATI Technologies ULC, Markham (CA)

( * ) Notice: Subject to any disclaimer, the term of this patent is extended or adjusted under 35 U.S.C. 154(b) by 25 days.

(21) Appl. No.: 12/878,795

(22) Filed: Sep. 9, 2010

(65) Prior Publication Data
US 2012/0061852 A1    Mar. 15, 2012

(51) Int. Cl.
*H01L 21/00*    (2006.01)
(52) U.S. Cl.
USPC .......................................... 438/110; 438/126
(58) Field of Classification Search
USPC .................................. 438/106–127
See application file for complete search history.

(56) References Cited

U.S. PATENT DOCUMENTS

| | | | |
|---|---|---|---|
| 6,472,758 B1 | 10/2002 | Glenn et al. | |
| 7,198,980 B2 | 4/2007 | Jiang et al. | |
| 7,223,638 B2 * | 5/2007 | Starkston | 438/122 |
| 7,553,702 B2 * | 6/2009 | Fitzgerald et al. | 438/122 |
| 2002/0028533 A1 | 3/2002 | Tang et al. | |
| 2003/0173679 A1 | 9/2003 | Levardo et al. | |
| 2004/0080055 A1 | 4/2004 | Jiang | |
| 2005/0140023 A1 | 6/2005 | Kinoshita et al. | |
| 2005/0167798 A1 | 8/2005 | Doan | |
| 2005/0212109 A1 | 9/2005 | Cherukuri et al. | |
| 2005/0280160 A1 | 12/2005 | Kim et al. | |
| 2007/0181992 A1 | 8/2007 | Lake | |
| 2007/0200234 A1 | 8/2007 | Gerber et al. | |
| 2008/0169555 A1 | 7/2008 | Topacio et al. | |

OTHER PUBLICATIONS

PCT/US2011/051058 International Search Report mailed Nov. 29, 2011.

\* cited by examiner

*Primary Examiner* — Richard Booth
(74) *Attorney, Agent, or Firm* — Timothy M. Honeycutt

(57) ABSTRACT

A method of manufacturing is provided that includes providing a semiconductor chip with an insulating layer. The insulating layer includes a trench. A second semiconductor chip is stacked on the first semiconductor chip to leave a gap. A polymeric filler is placed in the gap wherein a portion of the polymeric filler is drawn into the trench.

23 Claims, 4 Drawing Sheets

SEMICONDUCTOR CHIP DEVICE WITH POLYMERIC FILLER TRENCH

BACKGROUND OF THE INVENTION

1. Field of the Invention

This invention relates generally to semiconductor processing, and more particularly to stacked semiconductor chip devices with an polymeric filler and to methods of assembling the same.

2. Description of the Related Art

Stacked semiconductor chip devices present a host of challenges for package integration. Many of these technical challenges are associated with the differences in topography between the base chip and the one or more chips stacked thereon. One particular technical challenge associated with stacked chip devices is thermal management. Many conventional single chip semiconductor chip packages incorporate a heat spreader or lid that is placed in thermal contact with a backside of a semiconductor chip by way of a thermal interface material. Some conventional thermal interface materials consist of polymers such as thermal greases. For higher heat dissipation devices, package designers have turned to solder type thermal interface materials such as indium.

It is desirable, if indium is used as a thermal interface material, to ensure that the indium metallurgically bonds to both the base semiconductor chip and the overlying heat spreader in those designs where the stacked semiconductor chips have a smaller footprint than the base semiconductor chip. However, indium does not readily wet to many types of materials. Accordingly, a wetting film is typically formed on surfaces where metallurgical bonding with indium is desired.

In order for a conventional wetting film to successfully bond with indium, there should be no contaminants that might interfere with the bonding during a thermal reflow process. One potential contaminant that is an important feature of many semiconductor chip package designs is an underfill, which is placed between two substrates to lessen the effects of differences in the coefficients of thermal expansion between the two substrates. It is thus desirable to keep underfill from contaminating a portion of a wetting film slated for metallurgical bonding.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes providing a semiconductor chip that has an insulating layer. The insulating layer includes a trench. A second semiconductor chip is stacked on the first semiconductor chip to leave a gap. A polymeric filler is placed in the gap wherein a portion of the polymeric filler is drawn into the trench.

In accordance with another aspect of an embodiment of the present invention, a method of manufacturing is provided that includes applying an insulating layer to a first semiconductor chip and forming a trench in the insulating layer. The trench is adapted to receive a polymeric filler. The first semiconductor chip is adapted to have a second semiconductor chip stacked thereon to leave a gap in which a portion of the polymeric filler is positioned.

In accordance with another aspect of an embodiment of the present invention, an apparatus is provided that includes a first semiconductor chip and an insulating layer on the first semiconductor chip. The insulating layer includes a trench. A second semiconductor chip is stacked on the first semiconductor chip to leave a gap. A polymeric filler is positioned in the gap wherein a portion of the polymeric filler is in the trench.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various stacked semiconductor chip arrangements are disclosed. The disclosed embodiments incorporate an insulating film, which may serve as a passivation structure, that includes a trench. The trench is designed to draw in polymeric filler during polymeric filler application and curing so that contamination of a solder wetting film is avoided. In essence, the trench restrains lateral movement of the polymeric filler where it might otherwise coat the wetting film. Additional details will now be described.

Figure 1:
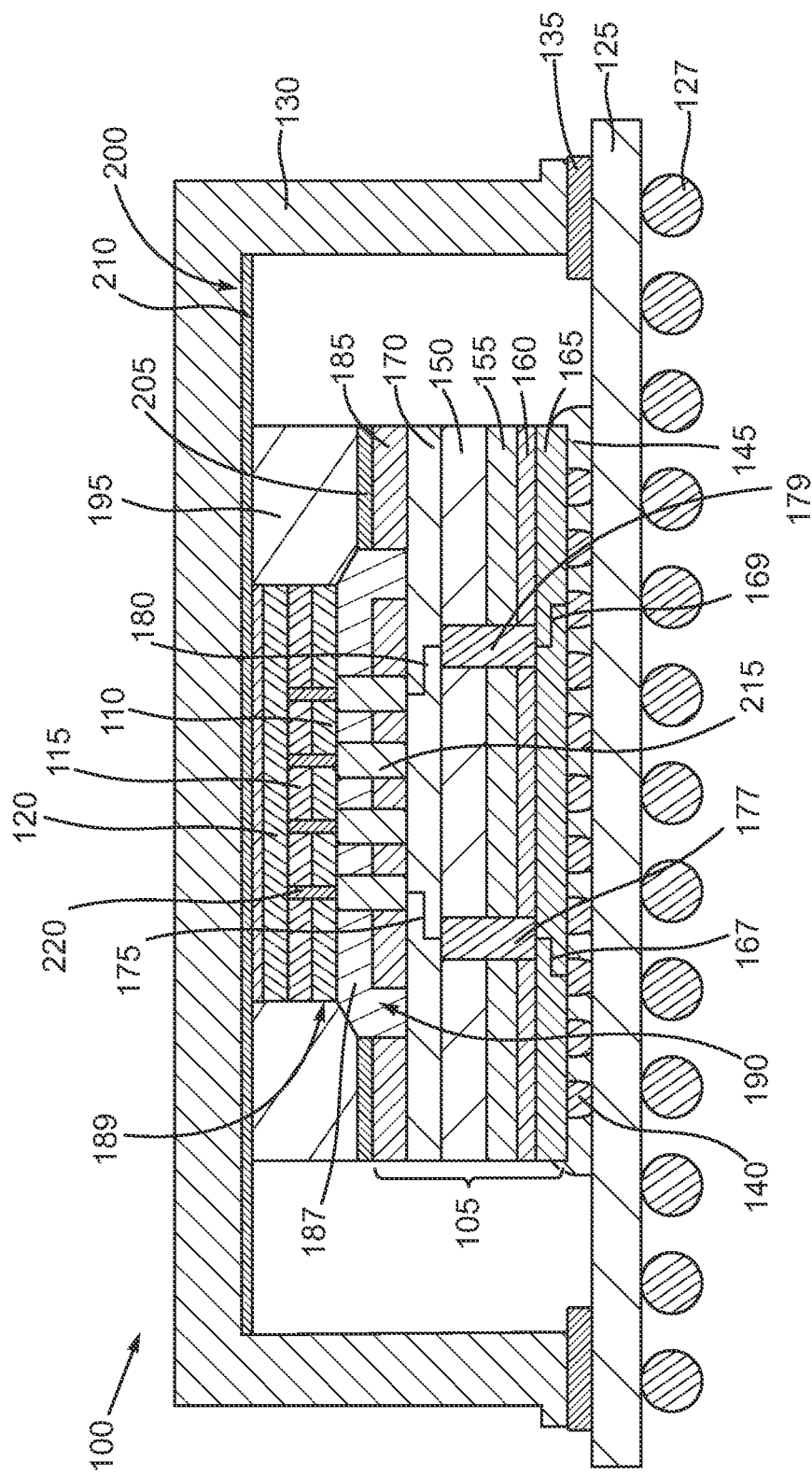
FIG. 1 is a sectional view of an exemplary embodiment of a semiconductor chip device that includes an arrangement of a semiconductor chip and three semiconductor chips stacked thereon.

In the drawings described below, reference numerals are generally repeated where identical elements appear in more than one figure. Turning now to the drawings, and in particular to FIG. 1, therein is shown a sectional view of an exemplary embodiment of a semiconductor chip device 100 that includes an arrangement of a semiconductor chip 105 and three semiconductor chips 110, 115 and 120 stacked thereon. The semiconductor chip 105 may include multiple strata that will be described in more detail below. It should be understood that the semiconductor chip 105 and the chips 110, 115 and 120 may be mounted to any of a myriad of different types of circuit boards or carrier substrates as desired. The mounting structures and techniques described herein are not limited to any particular types of semiconductor devices. Thus, the semiconductor chips 105, 110, 115 and 120 may be any of a myriad of different types of circuit devices used in electronics, such as, for example, microprocessors, graphics processors, combined microprocessor/graphics processors, application specific integrated circuits, memory devices, active optical devices, such as lasers, or the like, and may be single or multi-core or even stacked laterally with additional dice. Furthermore, one or more of the semiconductor chips 105, 110, 115 and 120 could be configured as an interposer with or without some logic circuits. Thus the term "chip" includes an interposer and vice versa. The semiconductor chips 105, 110, 115 and 120 may be constructed of bulk semiconductor, such as silicon or germanium, or semiconductor on insulator materials, such as silicon-on-insulator materials, or even other types of materials, even insulating materials such as silicon dioxide, tetra-ethyl-ortho-silicate or others. It should be understood that the number of chips may be varied.

In this illustrative embodiment, the semiconductor chips 105, 110, 115 and 120 may be mounted to a circuit board 125. The circuit board 125 may take on a variety of configurations. Examples include a semiconductor chip package substrate, a circuit card, or virtually any other type of printed circuit board. Although a monolithic structure could be used for the circuit board 125, a more typical configuration will utilize a buildup design. In this regard, the circuit board 125 may consist of a central core upon which one or more buildup layers are formed and below which an additional one or more buildup layers are formed. The core itself may consist of a stack of one or more layers. If implemented as a semiconductor chip package substrate, the number of layers in the circuit board 125 can vary from four to sixteen or more, although less than four may be used. So-called "coreless" designs may be used as well. The layers of the circuit board 125 may consist of an insulating material, such as various well-known epoxies, interspersed with metal interconnects. A multi-layer configuration other than buildup could be used. Optionally, the circuit board 125 may be composed of well-known ceramics or other materials suitable for package substrates or other printed circuit boards. The circuit board 125 is provided with a number of conductor traces and vias and other structures (not visible) in order to provide power, ground and signals transfers between the semiconductor chips 105, 110, 115 and 120 and another device, such as another circuit board for example. Input/output structures, such as solder balls 127 in this illustrative embodiment, may be used to interface the circuit board 125 with another device. Of course, systems other than a ball grid array may used, such as pin grid arrays, land grid arrays or others.

To facilitate the transfer of heat from the semiconductor chips 105, 110, 115 and 120 the semiconductor chip device 100 may be provided with a heat spreader or lid 130 which may be secured to the circuit board 125 by way of an adhesive bead 135. The adhesive 135 may be a well-known thixotropic adhesive, an epoxy, another type of polymer or even a solder. The lid 130 may be any of a variety of different configurations such as the top hat configuration depicted in FIG. 1, a bath tub design or other configuration as desired. Many different types of materials may be used for the lid 130 such as well-known plastics, ceramics or metallic materials as desired. Some exemplary materials include nickel plated copper, anodized aluminum, aluminum-silicon-carbide, aluminum nitride, boron nitride or the like.

The semiconductor chip 105 is flip-chip mounted to the circuit board 125 and electrically connected thereto by way of plural interconnect structures 140. The interconnect structures 140 may be, for example, conductive bumps, conductor pillars with or without solder enhancement or other types of interconnect structures. While only a few of the interconnect structures 140 are visible, there may be scores, hundreds or even thousands of such conductor structures depending upon the size and complexity of the semiconductor chip 105. An underfill material layer 145 may be interposed between the semiconductor chip 105 and the circuit board 125 to help alleviate issues associated with differential CTE. The underfill material layer 145 may be composed of well-known epoxy materials, such as epoxy resin with or without silica fillers and phenol resins or the like. Two examples are types 119 and 2BD available from Namics. Additional details of the semiconductor chip 105 will now be described.

As noted above, the semiconductor chip 105 may consist of multiple strata. In this illustrative embodiment, the semiconductor chip 105 may consist of a bulk semiconductor layer 150, a device layer 155, a contact insulating layer 160 and a metallization layer 165. The bulk semiconductor layer 155 may be composed of silicon, germanium or other materials suitable for integrated circuit fabrication. The device layer 155 may consist of a myriad of circuit structures including transistors, capacitors or the like. The contact insulating layer 160 may consist of silicon dioxide, or other well-known insulating materials suitable for contact insulating layers and may be monolithic or laminate. The metallization layer 165 may consist of plural alternating layers of metallization and interlevel dielectric films and may include several such films. Two portions of the metallization layer 165 are represented schematically by the lines 167 and 169. On the opposite side of the bulk semiconductor layer 150, a redistribution layer 170 is provided. The RDL layer 170 may consist of one or more layers of metallization and interlevel dielectric films that provide RDL functionality. Two RDL conductor structures are depicted and represented schematically by the lines 175 and 180. However, the skilled artisan will appreciate that the actual number of metallization structures that make up both the RDL layer 170 and the metallization layer 165 may be quite numerous. Plural thru-silicon-vias (TSV), two of which are shown and labeled 177 and 179 may stretch through the semiconductor layer 150, the device layer 155 and the contact insulating layer 160. While two are shown, the TSV's 177 and 179 may number in the scores or more.

Still referring to FIG. 1, a passivation layer 185 is positioned on the RDL layer 170. The passivation layer 185 may be a monolithic layer composed of well-known passivation layer materials, such as, for example, silicon dioxide, silicon nitride, polyimide or the like. Optionally, the passivation layer 185 may be a laminate of multiple layers of insulating material, such as alternating layers of silicon dioxide and silicon nitride as desired. A polymeric filler 187 is disposed between the passivation layer 185 and the semiconductor chip 110 and serves to lessen the effects of differential CTE among the semiconductor chips 105, 110, 115 and 120. The polymeric filler 187 may be composed of the same types of materials described for the underfill 145, or even from non-conducting adhesives, such as compression bonding adhesives. The passivation layer 185 is provided with a trench 190 that is advantageously positioned proximate an outer wall 189 of at least one, and preferably the lowermost, of the semiconductor chips 110, 115 and 120. The trench 190 functions to draw down and contain a portion of the polymeric filler 187. One technical goal of drawing the portion of the polymeric filler 187 into the trench 190 is to prevent polymeric filler 187 from spreading across and curing on the upper surface of the wetting film 205. If portions of the polymeric filler 187 coat and cure on the upper surface of the wetting film 205, then the solder-type thermal interface material 195 may not wet to the wetting film 205 in those coated areas and produce either air pockets or other types of delaminated regions which will greatly increase the thermal impedance of the pathway between the semiconductor chip 105 and the thermal interface material 195. Another related technical goal is to enable portions of the polymeric filler 187 to aggregate near at least the wall 189 of the semiconductor chip 110. The built up polymeric filler 187 near the wall 189 acts like a spring to cushion thermal strains.

To aid in the transfer of heat from both the semiconductor chip 105 and the semiconductor chips 110, 115 and 120 to the lid 130, a thermal interface material 195 may be disposed between the semiconductor chip 105 and the lid 130 and around the semiconductor chips 110, 115 and 120. A variety of materials may be used for the thermal interface material 195, such as, for example, various solders or organic thermal interface materials. Exemplary metallic materials include, for example, indium, indium solder, tin-silver, bismuth-tin, other tin solders, gallium plus a polymer or the like. Various non-metallic materials include a variety of polymeric materials suitable for thermal interface materials such as, for example, silicone rubber mixed with zinc oxide. Optionally, compliant base materials other than silicone rubber and thermally but not electrically conductive particles may be used.

It is desirable for the solder-type thermal interface material 195 to readily wet to the upper surface of the semiconductor chip 105 and the lower surface 200 of the lid 130. Since the passivation layer 185 may not readily wet to solder-type materials, a wetting film 205 is advantageously formed or otherwise positioned on the passivation structure 185. Similarly, a wetting film 210 may be formed or otherwise applied to the lower surface 200 of the lid 130. The composition of the wetting films 205 and 210 may be tailored to advantageously provide favorable wetting of the solder-type thermal interface material 195. For example, where the thermal interface material 195 is composed of indium or alloys thereof, gold or platinum may be suitable materials for the wetting films 205 and 210.

Electrical interfaces between the semiconductor chip 105 and the semiconductor chips 110, 115 and 120 may be provided by way of plural conductor pillars 215, solder joints or the like. Conductor pillars 215 may be composed of various conductors, such as copper, silver, nickel, platinum, gold, aluminum, palladium, alloys or laminates of these or the like, and may be capped with solder. The semiconductor chips 110, 115 and 120 may connect electrically with the pillars 215 by way of plural thru-silicon vias 220. Thus, a typical exemplary electrical pathway from say the semiconductor chip 120 to one of the interconnect structures 140 may include one of the thru-silicon vias 220, one of the conductive pillars 215, the RDL structure represented schematically by the line 175, the thru-silicon via 177, the metallization structure represented schematically by the line 167 and one of the interconnect structures 140. However, the skilled artisan will appreciate that a large variety of different types of conductor structures and electrical interconnect schemes may be used to connect up the various semiconductor chips 105, 110, 115 and 120 and the circuit board 125.

Figure 2:
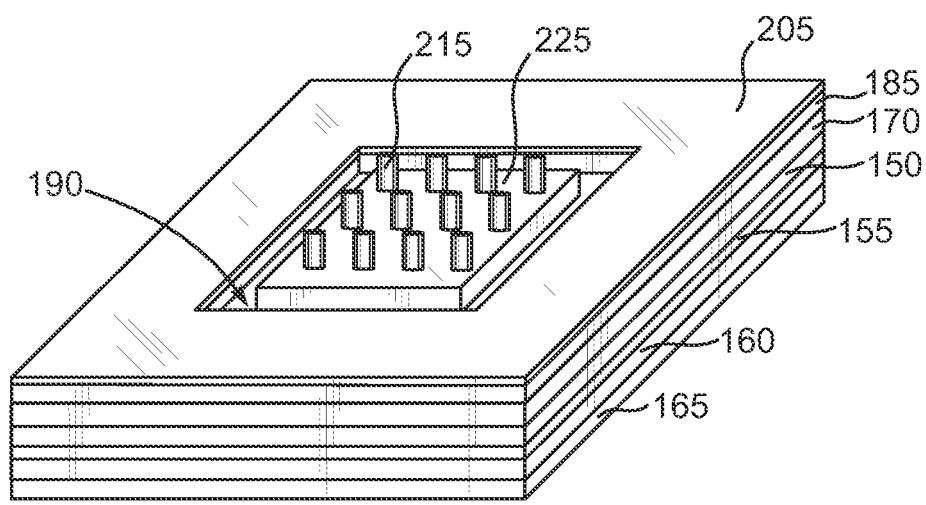
FIG. 2 is a pictorial view of the stacked arrangement of the semiconductor chips.

Attention is now turned also to FIG. 2, which is a pictorial view of the semiconductor chip 105 removed from the semiconductor chip device 100 and without the semiconductor chips 110, 115 and 120 stacked thereon. Note that the bulk semiconductor layer 150, the device layer 155, the contact insulating layer 160, the metallization laminate 165, the RDL layer 170, the passivation layer 185 and the wetting film 205 are visible. The plural conductor pillars 215 are visible projecting upward from a central portion 225 of the passivation layer 185. The footprint of the central portion 225 is defined by the shape and size of the trench 190. In this illustrative embodiment, the trench 190 in the passivation layer 185 may have the same general footprint, that is, rectangular, square, etc. of the semiconductor chip 105 or a different footprint as desired.

Figure 3:
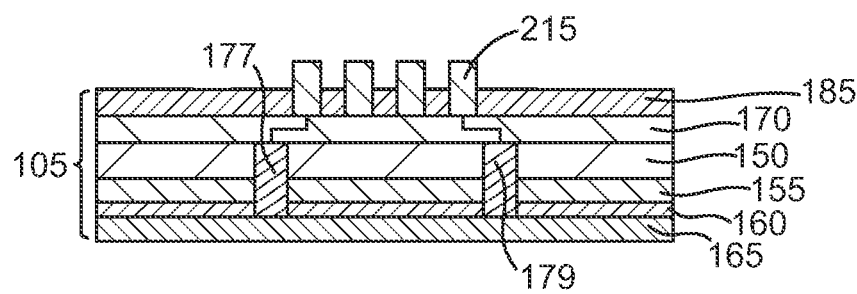
FIG. 3 is a sectional view of one of the semiconductor chips depicting insulating layer application.

An exemplary method for fabricating the passivation layer 185, the trench 190 therein and the customized polymeric filler 187 may be understood by referring now to FIGS. 3, 4, 5 and 6 and initially to FIG. 3. FIG. 3 is a sectional view of the semiconductor chip 105 following fabrication of the device layer 155 on the bulk semiconductor layer 150, the contact insulating layer 160 and the metallization laminate 165. In addition, the RDL layer 170 and the TSVs 177 and 179 have been constructed using well-known techniques. The passivation layer 185 may be formed by well-known material deposition and patterning techniques. In an exemplary embodiment, multiple layers of silicon dioxide and silicon nitride may be alternately applied to establish a laminate structure. The number of alternating layers may be three layers of silicon dioxide and three layers of silicon nitride for example. Well-known chemical vapor deposition techniques may be used to apply the passivation layer 185. Similarly, the conductive pillars 215 may be fabricated on the semiconductor chip 105 either before or after the formation of the passivation layer 185.

Figure 4:
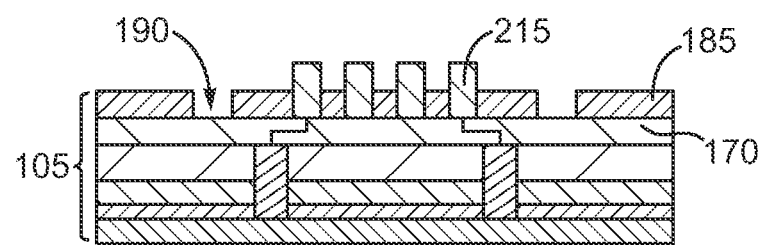
FIG. 4 is a sectional view of the semiconductor chip depicting trench formation in the insulating layer.
Figure 5:
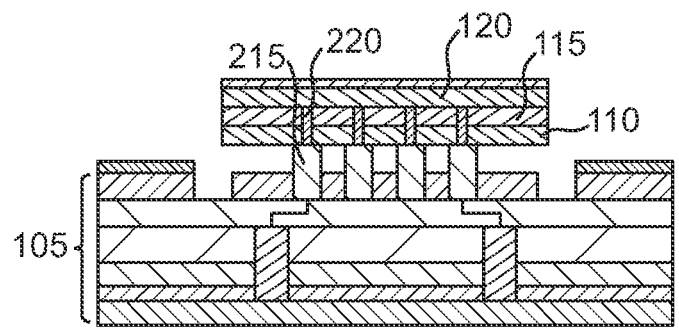
FIG. 5 is a sectional view of the semiconductor chip depicting stacking of one or more additional semiconductor chips.

At this stage, the passivation layer 185 is set for the formation of the trench. Attention is now turned to FIG. 4, which shows the formation of the trench 190. The trench 190 may be fabricated using a variety of techniques such as well-known lithography and chemical etch definition, laser ablation or even mechanical cutting. If lithography is used, then well-known resist mask application and patterning techniques may be applied. Optionally, a non-contact mask (not shown) may be used to cover the desired portions of the passivation film 185 while leaving the portion thereof exposed where the trench 190 will be formed. It may be possible to establish the trench 190 down to the RDL layer 170 as shown in FIG. 4. Optionally, the trench 190 may be formed to some lesser depth that does not extend entirely to the RDL layer 170. With the trench 190 formed, the aforementioned stack of semiconductor chips 110, 115 and 120 may be flip-chip or otherwise mounted to the conductor pillars 215. If a thermal step is necessary to establish the metallurgical bonding between the TSVs 220 and the conductor pillars 215, such as by way of solder reflow or otherwise, then the semiconductor chip 105 and the semiconductor chips 110, 115 and 120 may be subjected to some heating process at this stage. It should be understood that the semiconductor chips 110, 115 and 120 may be stacked on the semiconductor chip 105 while the semiconductor chip 105 is at the wafer level or following dicing.

Figure 6:
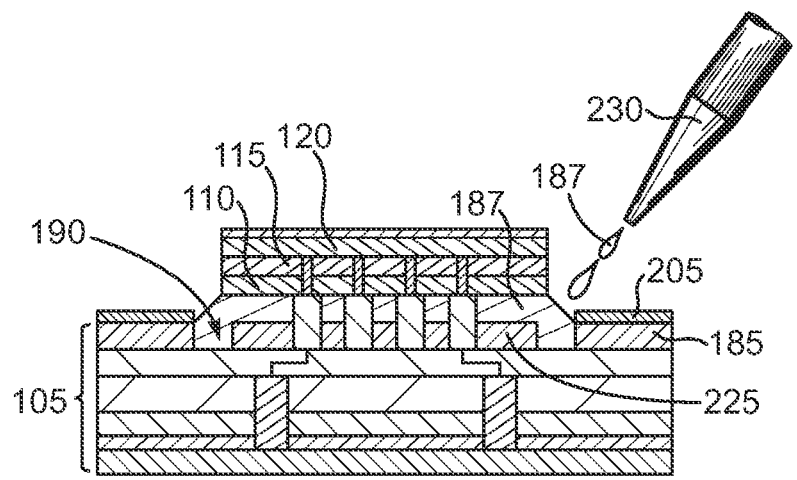
FIG. 6 is a sectional view of the stacked arrangement of semiconductor chips depicting application of a polymeric filler.

Next and as shown in FIG. 6, which is a sectional view of the semiconductor chip 105 and the semiconductor chips 110, 115 and 120, the polymeric filler 187 may be deposited by a suitable applicator 230. As the polymeric filler 187 is dispensed, capillary action will draw portions thereof between the semiconductor chip 110 and the central portion 225 of the passivation layer 185. A portion of the polymeric filler 187 will be drawn down into the trench 190 by a combination of both gravitational and surface tension forces, and thus away from the upper surface of the wetting film 205. In this way, the wetting film 205 will not be contaminated with portions of the polymeric filler 187. Following deposition, a suitable curing process may be used to set the polymeric filler 187. This may entail a heating step, an application of suitable radiation or a combination of the two as desired. One exemplary curing process involves heating to about 240 to 260° C. for about 30 minutes followed by a gradual ramp down.

Figure 7:
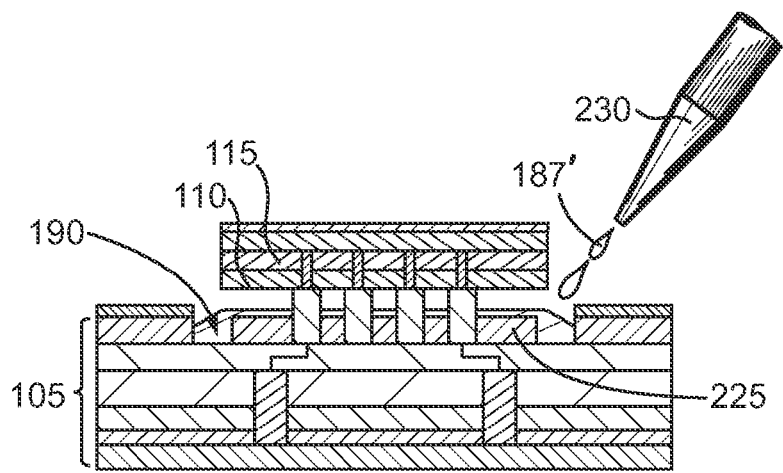
FIG. 7 is a sectional view of the stacked arrangement of semiconductor chips depicting an alternate exemplary application of a polymeric filler.
Figure 8:
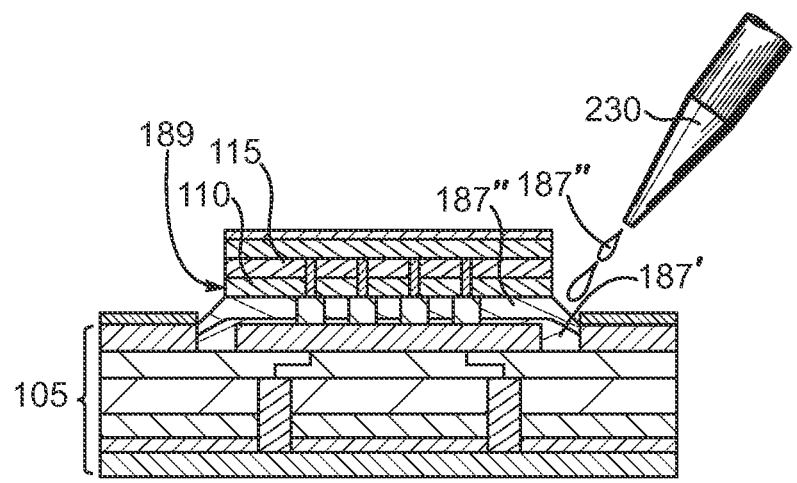
FIG. 8 is a sectional view of the stacked arrangement of semiconductor chips depicting an alternate exemplary second application of a polymeric filler.

In the exemplary method depicted in FIGS. 3, 4, 5 and 6, the polymeric filler 187 is dispensed as a monolithic layer. However, the skilled artisan will appreciate that a multi-staged deposition and curing process could also be used. In this regard, attention is now turned to FIGS. 7 and 8, which are sectional views like FIG. 6, but depict the semiconductor chip 105 undergoing a multi-stage filler deposition and curing process. Referring first to FIG. 7, an polymeric filler 187' may be dispensed from the applicator 230 so that at least a portion thereof flows into the trench 190 and perhaps some between the semiconductor chip 110 and the central portion 225 of the passivation layer 185 as shown. The polymeric filler 187' may be the same or a different type of filler as described elsewhere herein. At this stage, the polymeric filler 187' may be subjected to either a partial or full curing process. Next, and as shown in FIG. 8, an additional polymeric filler 187" of the type disclosed elsewhere herein may be dispensed on the polymeric filler 187' and subjected to a second curing process. Multiple such deposition and curing processes could be performed while still achieving the technical goal of providing a spring-like filler interface proximate the wall 189 of the semiconductor chip 110.

Figure 9:
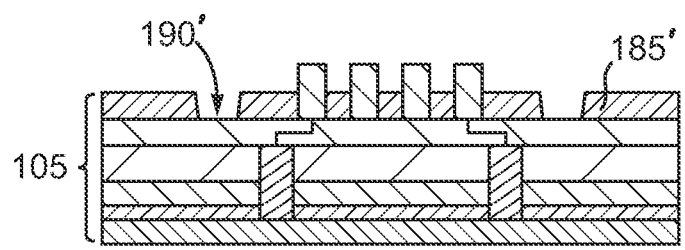
FIG. 9 is a sectional view of the semiconductor chip depicting alternate exemplary trench formation in the insulating layer.

In the foregoing illustrative embodiments, the trench 190 has relatively vertical sidewalls. However, the skilled artisan will appreciate that other than purely vertical profiles may be used. In this regard, attention is now turned to FIG. 9, which is a sectional view like FIG. 4, but of the semiconductor chip 105 fitted with an alternate exemplary passivation layer 185'. Here, a trench 190', which may serve the same function as the trench 190 described elsewhere herein, may be formed with sloped sidewalls as shown. A sloped sidewall profile for the trench 190' has the advantage of establishing a somewhat greater volume of filler, which can provide somewhat greater spring action and thus provide better protection for deleterious stresses and strains associated with differential CTE. The sloped sidewall profile of the trench 190 may be provided by varying etch chemistry and/or pressure and power if chemical etching with or without plasma enhancement is used. Optionally, the sloped sidewall may be provided by precise control over laser spot size, dwell time and power settings if laser ablation is used. The dimensions of any of the trenches 190 and 190' disclosed herein may be varied depending on device geometry and available material patterning techniques. In an exemplary embodiment the trenches 190 and 190' may be about 1 to 5 μm wide and deep.

Figure 10:
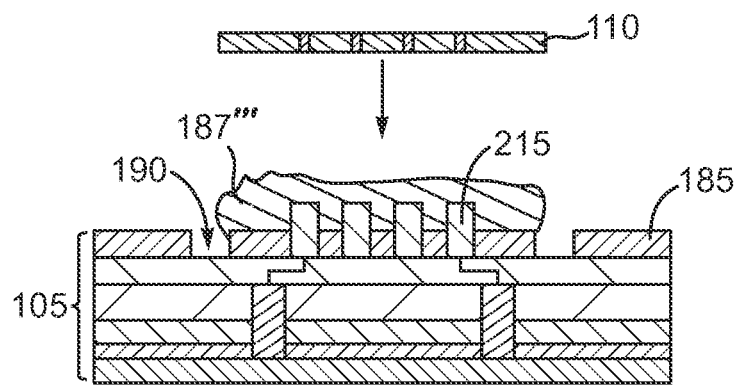
FIG. 10 is a sectional view the semiconductor chip depicting alternate exemplary polymeric filler deposition and processing.

In still another exemplary embodiment, a polymeric filler 187''' may be positioned on the semiconductor chip 105 prior to placement of a lowermost chip 110 and compression bonding used as shown in FIG. 10. Here the polymeric filler 187''' may be composed of the same types of materials as disclosed elsewhere herein and dispensed on the passivation layer 185 proximate the conductor pillars 215. Thereafter, the lowermost semiconductor chip 110 (or even stacks of such chips) may be compressed on the polymeric filler 187". The trench 190 will draw in a portion of the polymeric filler 187''' during the compression step.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   providing a semiconductor chip including an insulating layer, the insulating layer including a trench, the trench having a width and a length, the width being smaller than the length, the trench defined by opposing sidewalls of the insulating layer;
   stacking a second semiconductor chip on the first semiconductor chip to leave a gap between the second semiconductor chip and the insulating layer; and
   placing a polymeric filler in the gap wherein a portion of the polymeric filler is drawn into the trench.

2. The method of claim 1, comprising stacking a third semiconductor chip on the second semiconductor chip.

3. The method of claim 1, comprising forming the trench by removing material from the insulating layer.

4. The method of claim 1, comprising applying a solder wetting film to the insulating layer outside the trench.

5. The method of claim 4, comprising applying a solder thermal interface material to the solder wetting film.

6. The method of claim 1, comprising mounting the first semiconductor chip to a circuit board.

7. The method of claim 5, comprising placing a heat spreader in thermal contact with the solder thermal interface material.

8. The method of claim 1, wherein the opposing sidewalls comprise sloped sidewalls.

9. A method of manufacturing, comprising:
   applying an insulating layer to a first semiconductor chip, the insulating layer having an upper surface;
   forming a trench in the insulating layer, the trench having a width and a length, the width being smaller than the length, the trench being defined by opposing sidewalls of the insulating layer and adapted to receive a polymeric filler; and
   wherein the first semiconductor chip is adapted to have a second semiconductor chip stacked thereon to leave a gap between the second semiconductor chip and the insulating layer in which a portion of the polymeric filler is positioned and another portion of the polymeric filler is positioned on the upper surface of the insulating layer.

10. The method of claim 9, comprising forming the trench by removing material from the insulating layer.

11. The method of claim 9, comprising applying a solder wetting film to the insulating layer outside the trench.

12. The method of claim 11, comprising applying a solder thermal interface material to the solder wetting film.

13. The method of claim 9, comprising mounting the first semiconductor chip to a circuit board.

14. The method of claim 12, comprising placing a heat spreader in thermal contact with the solder thermal interface material.

15. A method of manufacturing, comprising:
   providing a semiconductor chip including an insulating layer, the insulating layer including a trench, the trench having a width and a length, the width being smaller than the length, the trench defined by opposing sidewalls of the insulating layer;
   stacking a second semiconductor chip on the first semiconductor chip to leave a gap between the second semiconductor chip and the insulating layer, the second semiconductor chip having an outer wall proximate the trench; and
   placing a polymeric filler in the gap wherein a portion of the polymeric filler is drawn into the trench, the trench being operable to restrain movement of the polymeric filler away from the outer wall.

16. The method of claim 15, wherein the outer wall is positioned directly above the trench.

17. The method of claim 15, comprising applying a solder wetting film to the insulating layer outside the trench.

18. The method of claim 17, comprising applying a solder thermal interface material to the solder wetting film.

19. The method of claim 15, comprising mounting the first semiconductor chip to a circuit board.

20. The method of claim 15, wherein the placement of the polymeric filler comprises placing a first portion of the polymeric filler, curing or partially curing the first portion, and placing and curing a second portion of the polymeric filler.

21. The method of claim 1, wherein the placement of the polymeric filler comprises placing a first portion of the polymeric filler, curing or partially curing the first portion, and placing and curing a second portion of the polymeric filler.

22. The method of claim 9, comprising placing the polymeric filler in the gap.

23. The method of claim 22, wherein the placement of the polymeric filler comprises placing a first portion of the polymeric filler, curing or partially curing the first portion, and placing and curing a second portion of the polymeric filler.

\* \* \* \* \*